(12) United States Patent
Robello et al.

(10) Patent No.: US 10,156,133 B2
(45) Date of Patent: Dec. 18, 2018

(54) DYNAMIC METHOD AND REAL TIME MONITORING OF UBD OPERATION TUNNEL ENVELOPE WITH MUD MOTOR

(71) Applicant: Landmark Graphics Corporation, Houston, TX (US)

(72) Inventors: Samuel Robello, Cypress, TX (US); Gabriela M. Morales-Ocando, Katy, TX (US); Zexun Zhou, Sugarland, TX (US); Xiaoqian Huang, Katy, TX (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 210 days.

(21) Appl. No.: 14/909,966

(22) PCT Filed: Oct. 4, 2013

(86) PCT No.: PCT/US2013/063528
§ 371 (c)(1),
(2) Date: Feb. 3, 2016

(87) PCT Pub. No.: WO2015/050563
PCT Pub. Date: Apr. 9, 2015

(65) Prior Publication Data
US 2016/0201445 A1   Jul. 14, 2016

(51) Int. Cl.
| | |
|---|---|
| *E21B 47/00* | (2012.01) |
| *E21B 7/00* | (2006.01) |
| *G06F 17/50* | (2006.01) |
| *E21B 21/08* | (2006.01) |
| *E21B 44/00* | (2006.01) |
| *E21B 21/00* | (2006.01) |

(52) U.S. Cl.
CPC ............ *E21B 47/00* (2013.01); *E21B 7/00* (2013.01); *E21B 21/08* (2013.01); *E21B 44/00* (2013.01); *G06F 17/5009* (2013.01); *E21B 2021/006* (2013.01)

(58) Field of Classification Search
CPC .................................................. G06F 17/5009
USPC ....................................... 703/2, 10; 166/380
See application file for complete search history.

(56) References Cited

U.S. PATENT DOCUMENTS

| | | |
|---|---|---|
| 3,982,432 A | 9/1976 | Hammond |
| 4,852,665 A | 8/1989 | Peltier et al. |

(Continued)

FOREIGN PATENT DOCUMENTS

| | | |
|---|---|---|
| EP | 0316985 B1 | 1/2000 |
| WO | WO-2005071222 A1 | 8/2005 |
| WO | WO-2010106014 A2 | 9/2010 |

OTHER PUBLICATIONS

International Search Report and Written Opinion, dated Jul. 3, 2014, 9 pages, Korean Intellectual Property Office.

(Continued)

*Primary Examiner* — Thai Q Phan

(57) ABSTRACT

The disclosed embodiments include a method, apparatus, and computer program product for monitoring underbalanced drilling operations. For example, one disclosed embodiment is a system that includes at least one processor and at least one memory coupled to the at least one processor and storing instructions that when executed by the at least one processor performs operations for generating a three dimensional tunnel view of an operating envelope of a well as the well is being drilled.

20 Claims, 5 Drawing Sheets

(56) References Cited

U.S. PATENT DOCUMENTS

| | | |
|---|---|---|
| 2004/0204855 A1 | 10/2004 | Fleury et al. |
| 2006/0293872 A1 | 12/2006 | Zamora et al. |
| 2009/0250264 A1 | 10/2009 | Dupriest |
| 2010/0241410 A1* | 9/2010 | McElhinney ............ E21B 7/04 703/10 |
| 2012/0325556 A1 | 12/2012 | Luxey |
| 2014/0000911 A1* | 1/2014 | Gorrara ................ E21B 43/106 166/380 |

OTHER PUBLICATIONS

Australian Government IP Australia, Patent Examination Report No. 1, Jun. 24, 2016, 6 pages, Australia.

* cited by examiner

DYNAMIC METHOD AND REAL TIME MONITORING OF UBD OPERATION TUNNEL ENVELOPE WITH MUD MOTOR

CROSS-REFERENCE TO RELATED APPLICATIONS

This application is a U.S. national stage patent application of International Patent Application No. PCT/US2013/063528, filed on Oct. 4, 2013, the benefit of which is claimed and the disclosure of which is incorporated herein by reference in its entirety.

BACKGROUND OF THE INVENTION

1. Field of the Invention

The present invention generally relates to the field of hydrocarbon recovery, and more particularly, to a computer-implemented method, system, and computer program product that is configured to provide a dynamic three dimensional tunnel view of an operating envelope of a UBD well while the well is being drilled.

2. Discussion of the Related Art

Underbalanced drilling, or UBD, is a procedure used to drill oil and gas wells where the pressure in the wellbore is kept lower than the fluid pressure in the formation being drilled. As the well is being drilled, formation fluid flows into the wellbore and up to the surface. This is the opposite of the usual situation, where the wellbore is kept at a pressure above the formation to prevent formation fluid entering the well. In such a conventional "overbalanced" well, the invasion of fluid is considered a kick, and if the well is not shut-in it can lead to a blowout, a dangerous situation. However, in underbalanced drilling, there is a "rotating head" that diverts produced fluids to a separator while allowing the drill string to continue rotating. If the formation pressure is relatively high, using a lower density mud will reduce the well bore pressure below the pore pressure of the formation. Sometimes an inert gas is injected into the drilling mud to reduce its equivalent density and hence its hydrostatic pressure throughout the well depth.

UBD operation requires advanced modeling for efficient selection of the proper liquid and gas injection rates. Currently, the UBD modeling process involves the development of static two-dimensional (2D) graphs that depict the operating envelope that defines the parameters (e.g., pressure and liquid rate) at given depth for drilling the well. However, present static operating envelope may not be reliable as the operating envelope may change as the well is drilled.

Thus, the disclosed embodiments seek to improve the process of UBD drilling by providing a computer-implemented method, system, and computer program product that is configured to provide a dynamic three dimensional tunnel view of an operating enveloping of a UBD well while the well is being drilled.

BRIEF DESCRIPTION OF THE DRAWINGS

Illustrative embodiments of the present invention are described in detail below with reference to the attached drawing figures, which are incorporated by reference herein and wherein.

DETAILED DESCRIPTION

The following description provides details of particular embodiments of the invention and is not intended to be exhaustive or limited to the invention in the form disclosed. The described embodiments are intended to explain the principles of the invention and the practical application, and to enable others of ordinary skill in the art to understand and practice the claimed invention. Many modifications and variations will be apparent to those of ordinary skill in the art without departing from the scope and spirit of the invention. The scope of the claims is intended to broadly cover the disclosed embodiments and any such modifications.

As used herein, the singular forms "a", "an" and "the" are intended to include the plural forms as well, unless the context clearly indicates otherwise. It will be further understood that the terms "comprise" and/or "comprising," when used in this specification and/or the claims, specify the presence of stated features, steps, operations, elements, and/or components, but do not preclude the presence or addition of one or more other features, steps, operations, elements, components, and/or groups thereof. The corresponding structures, materials, acts, and equivalents of all means or step plus function elements in the claims below are intended to include any structure, material, or act for performing the function in combination with other claimed elements as specifically claimed.

As previously stated, the disclosed embodiments seek to improve the process of UBD drilling by providing a computer-implemented method, system, and computer program product that is configured to monitor underbalanced drilling operations by providing a dynamic three dimensional tunnel view of an operating envelope of a UBD well while the well is being drilled. One advantage of the disclosed embodiments is that they enable a UBD engineer to visualize on a tunnel view, as the well is being drilled, the area between the reservoir and the target pressure that guarantees the optimum hole cleaning at a given gas injection and liquid pumping rate and a good mud motor operation (this area is referred herein as the conditions of interest).

The disclosed embodiments and additional advantages thereof are best understood by referring to FIGS. 1-6 of the drawings, like numerals being used for like and corresponding parts of the various drawings. Other features and advantages of the disclosed embodiments will be or will become apparent to one of ordinary skill in the art upon examination of the following figures and detailed description. It is intended that all such additional features and advantages be included within the scope of the disclosed embodiments.

Further, the illustrated figures are only exemplary and are not intended to assert or imply any limitation with regard to the environment, architecture, design, or process in which different embodiments may be implemented.

Figure 1:
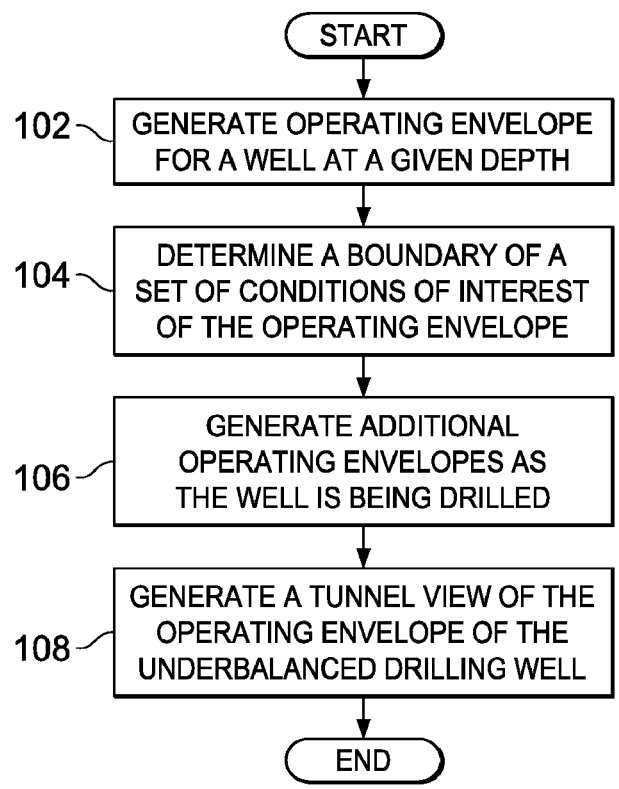
FIG. 1 is a flowchart illustrating an example of a computer implemented method for providing a dynamic three dimensional tunnel view of an operating envelope of a UBD well while the well is being drilled in accordance with the disclosed embodiments.

Beginning with FIG. 1, a flowchart is presented that illustrates an example of a computer implemented method 100 for providing a dynamic three dimensional tunnel view of the conditions of interest of an operating envelope of a UBD well while the well is being drilled in accordance with the disclosed embodiments. Starting with step 102, the method 100 generates an operating envelope for a well at a given depth. At step 104, the method 100 determines the boundary of the conditions of interest of the operating envelope. For instance, in one embodiment, the method 100 determines the boundary by calculating the intersection points between the Reservoir Pressure and the Maximum Motor Liquid Rate; the Maximum Motor Liquid Rate and the Target Bottom Pressure; the Target bottom Pressure and the Minimum Liquid Velocity; and the Minimum liquid velocity and the Reservoir Pressure.

Figure 2:
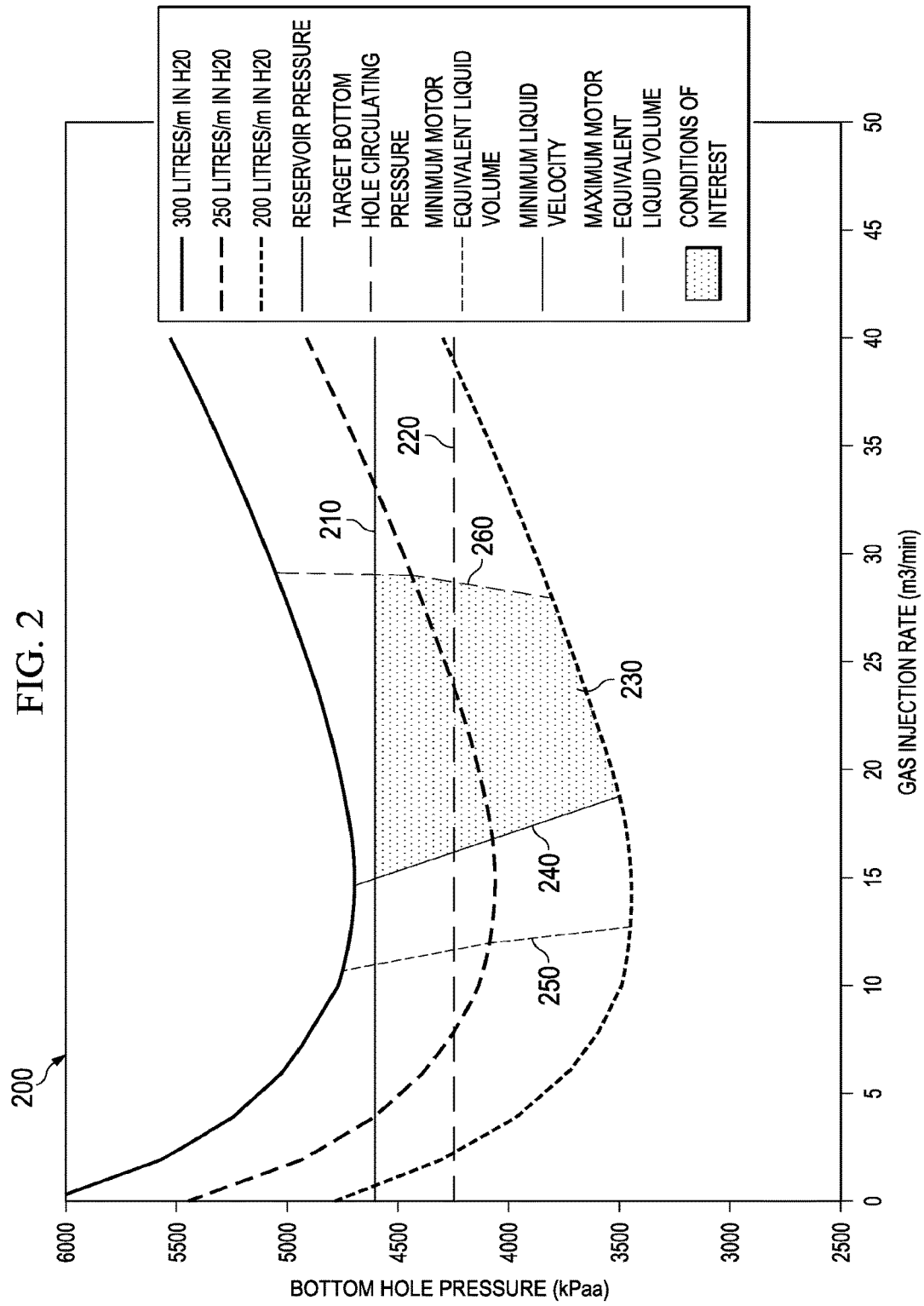
FIG. 2 is a graph illustrating an example of a two-dimensional operating envelope at a given depth of a well in accordance with the disclosed embodiments.

As an example, FIG. 2 is a graph 200 illustrating an example of a two-dimensional operating envelope at a given depth of a well that depicts the boundary of the conditions of interest in accordance with the disclosed embodiments. In the depicted embodiment, the bottomhole pressure is plotted on the y-axis and the gas injection rate is plotted on the x-axis. The bottomhole pressure is the pressure at the bottom of the hole. In one embodiment, this pressure may be calculated in a static, fluid-filled wellbore with the equation:

$$BHP=MW*Depth*0.052$$

where BHP is the bottomhole pressure in pounds per square inch, MW is the mud weight in pounds per gallon, Depth is the true vertical depth in feet, and 0.052 is a conversion factor if these units of measure are used. For circulating wellbores, the BHP increases by the amount of fluid friction in the annulus.

The gas injection rate is the rate in which an inert gas is injected into the drilling mud to reduce its equivalent density and hence the hydrostatic pressure throughout the well depth. In one embodiment, the gas is nitrogen, as it is non-combustible and readily available. In other embodiments, air, reduced oxygen air, processed flue gas or natural gas may also be used in this fashion.

In the depicted example, three liquid pumping rates (300 liters/min, 250 liters/min, and 200 liters/min) are plotted on the graph 200. In addition, the graph 200 plots the reservoir pressure 210 and the target bottom hole circulating pressure 220. The shaded area 230 indicates the conditions of interest, where the various constraints (minimum liquid velocity 240, minimum motor equivalent liquid volume (ELV) 250, maximum motor ELV 260, and the target drawdown) during UBD operations are fulfilled. Thus, FIG. 2 provides a static view of the operating envelope and conditions of interest at a given depth of the well.

Figure 3:
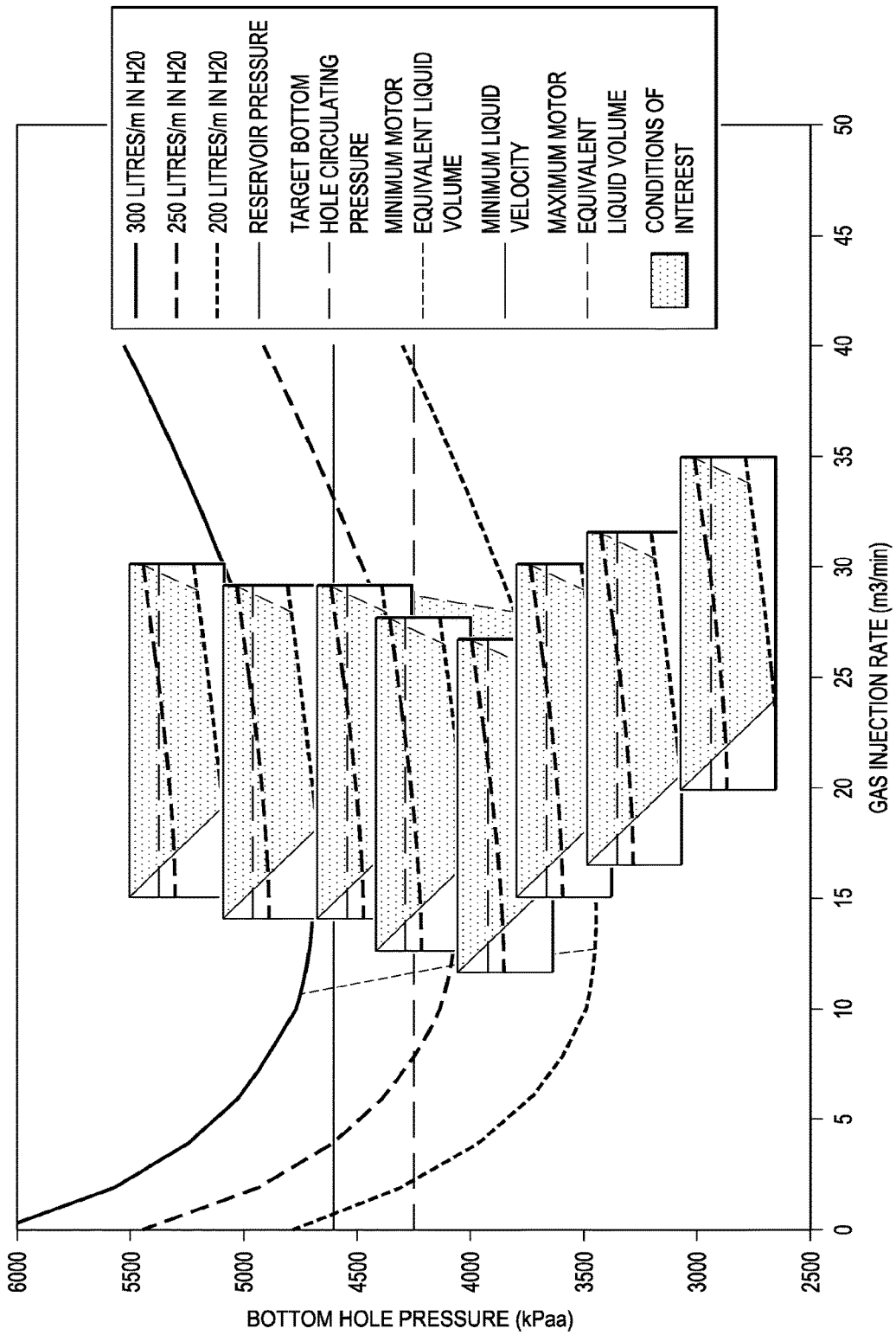
FIG. 3 is a diagram illustrating a plurality of two-dimensional operating envelopes at determined at various depths/times while a well is being drilled in accordance with the disclosed embodiments.
Figure 4:
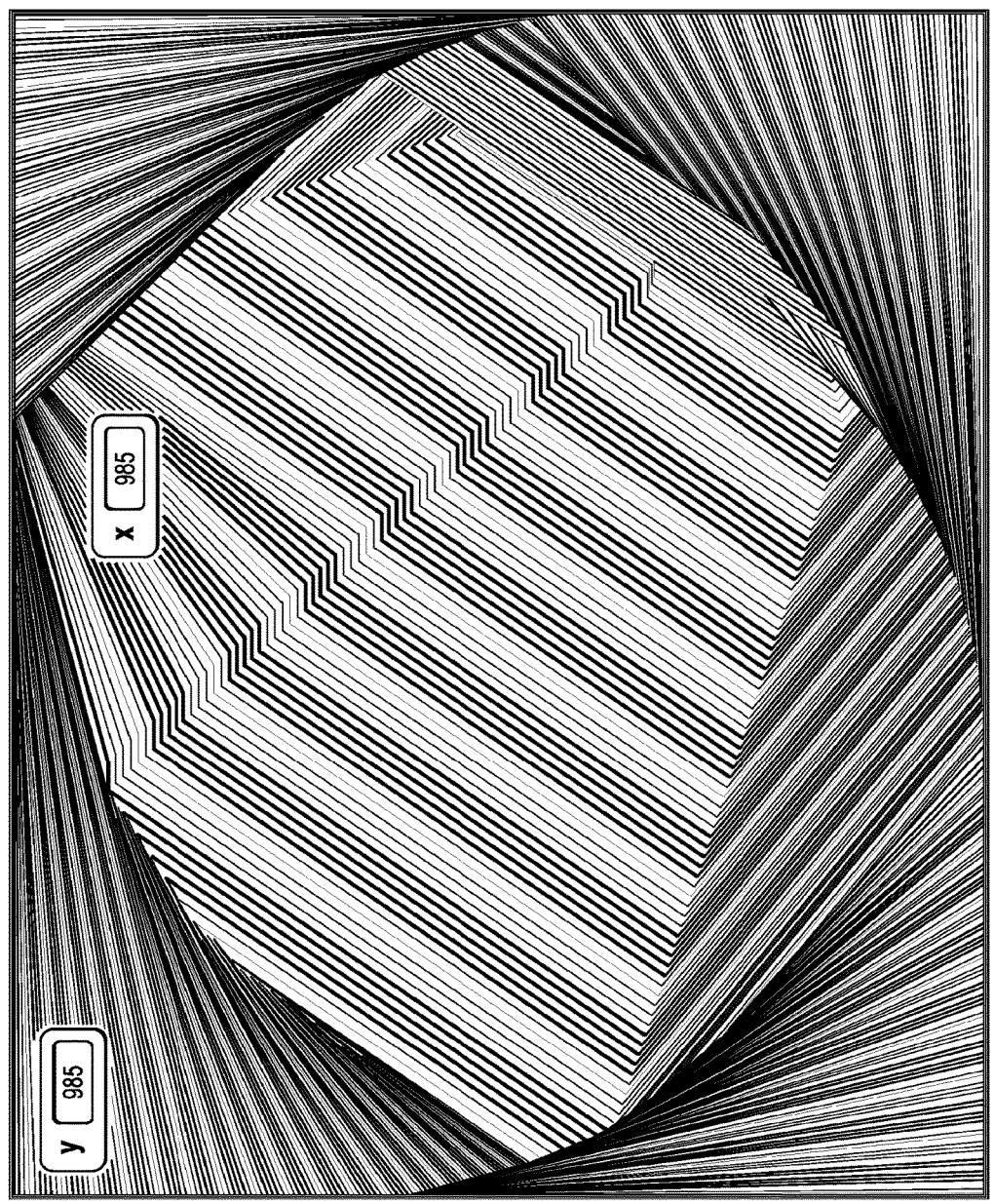
FIG. 4 is a diagram illustrating an example a three dimensional tunnel view of an operating envelope of a UBD well at a given depth while the well is being drilled in accordance with the disclosed embodiments.

Referring back to FIG. 1, the method 100, at step 106, uses the above operating envelope and generates additional views of the operating envelope at various depths/times as the well is being drilled. For instance, in one embodiment, as the well is being drilled, the Hole Section and String Depth will be re-adjusted to generate another operating envelope. As an example illustration, FIG. 3 is a diagram depicting a plurality of two-dimensional operating envelopes at various depths of a well in accordance with the disclosed embodiments.

At step 108, the method 100 generates a tunnel view of the operating envelope of the UBD well. In one embodiment, the tunnel view is generated by layering/overlapping the operating envelope at the various depths/times of the well. In some embodiments, the tunnel view will have a start depth, an end depth, and intermediate step depths. In certain embodiments, the user may define the start depth, end depth, and intermediate step depths. Additionally, in some embodiments, the method 100 may perform an interpolation method such as, but not limited to, curve fitting or regression analysis, for determining various intermediate points between overlapping operating envelopes to enable a smooth/smoother dynamic moving three dimensional tunnel view that enables a user to view/estimate the operating envelope in three dimension with respect to time or depth as the well is being drilled as depicted in the example illustration of FIG. 4.

Figure 5:
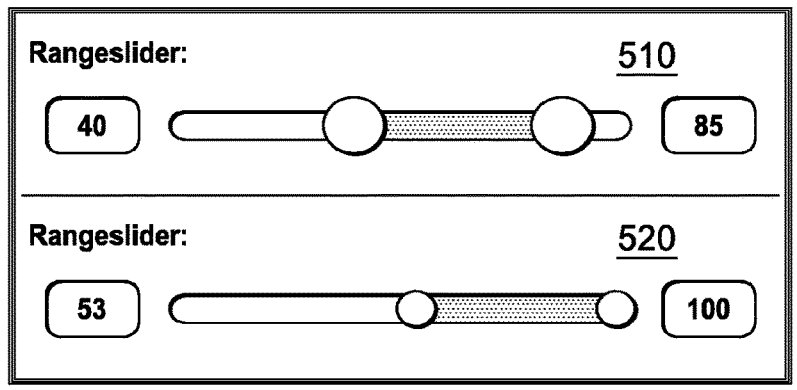
FIG. 5 is a diagram illustrating an example of a depth slider and a time slide in accordance with the disclosed embodiments.

In certain embodiments, the computer implemented method 100 may further include steps/instructions for enabling a user to use a depth slider 510 or time slider 520, as illustrated in FIG. 5, to view a snapshot or a whole plot of the operating envelope. For instance, in one embodiment, using the depth slider 510 or time slider 520, the disclosed embodiments can provide a visualization, at a user-desired depth/time position, the operating envelop that corresponds to the changes on the well as it is drilled. In some embodiments, the method may be configured to provide/display both a three-dimensional tunnel view of the operating envelope and a two dimensional static view of the operating envelope.

Figure 6:
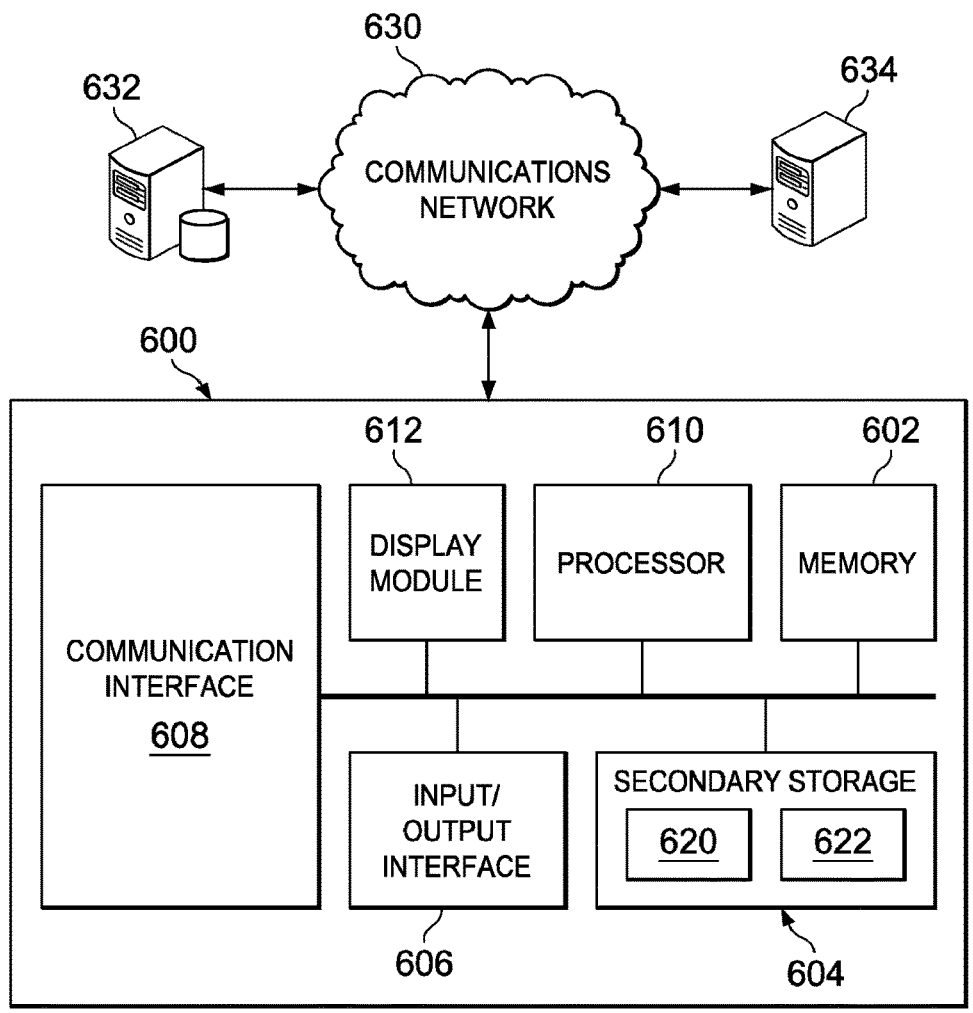
FIG. 6 is a block diagram illustrating one embodiment of a system for implementing the disclosed embodiments.

FIG. 6 is a block diagram illustrating one embodiment of a system 600 for implementing the features and functions of the disclosed embodiments. The system 600 may be any type of computing device such as, but not limited to, a personal computer, a server system, a client system, a laptop, a tablet, and a smartphone. The system 600 includes, among other components, a processor 610, main memory 602, secondary storage unit 604, an input/output interface module 606, and a communication interface module 608. The processor 610 may be any type or any number of single core or multi-core processors capable of executing instructions for performing the features and functions of the disclosed embodiments.

The input/output interface module 606 enables the system 600 to receive user input (e.g., from a keyboard and mouse) and output information to one or more devices such as, but not limited to, printers, external data storage devices, and audio speakers. The system 600 may optionally include a separate display module 612 to enable information to be displayed on an integrated or external display device. For instance, the display module 612 may include instructions or hardware (e.g., a graphics card or chip) for providing enhanced graphics, touchscreen, and/or multi-touch functionalities associated with one or more display devices.

Main memory 602 is volatile memory that stores currently executing instructions/data or instructions/data that are prefetched for execution. The secondary storage unit 604 is non-volatile memory for storing persistent data. The secondary storage unit 604 may be or include any type of data storage component such as a hard drive, a flash drive, or a memory card. In one embodiment, the secondary storage unit 604 stores the computer executable code/instructions and other relevant data for enabling a user to perform the features and functions of the disclosed embodiments.

For example, in accordance with the disclosed embodiments, the secondary storage unit 604 may permanently store the executable code/instructions associated with a casing design application 620 for performing the above-described methods. The instructions associated with the casing design algorithm 620 are loaded from the secondary storage unit 604 to main memory 602 during execution by the processor 610 for performing the disclosed embodiments.

The communication interface module 608 enables the system 600 to communicate with the communications network 630. For example, the network interface module 608 may include a network interface card and/or a wireless transceiver for enabling the system 600 to send and receive data through the communications network 630 and/or directly with other devices.

The communications network 630 may be any type of network including a combination of one or more of the following networks: a wide area network, a local area network, one or more private networks, the Internet, a telephone network such as the public switched telephone network (PSTN), one or more cellular networks, and wireless data networks. The communications network 630 may include a plurality of network nodes (not depicted) such as routers, network access points/gateways, switches, DNS servers, proxy servers, and other network nodes for assisting in routing of data/communications between devices.

For example, in one embodiment, the system 600 may interact with one or more servers 634 or databases 632 for performing the features of the present invention. For instance, the system 600 may query the database 632 to obtain well data for updating the three dimensional tunnel view of the operating envelope in real-time in accordance with the disclosed embodiments. Further, in certain embodiments, the system 600 may act as a server system for one or more client devices or a peer system for peer to peer communications or parallel processing with one or more devices/computing systems (e.g., clusters, grids).

While specific details about the above embodiments have been described, the above hardware and software descriptions are intended merely as example embodiments and are not intended to limit the structure or implementation of the disclosed embodiments. For instance, although many other internal components of the system 600 are not shown, those of ordinary skill in the art will appreciate that such components and their interconnection are well known.

In addition, certain aspects of the disclosed embodiments, as outlined above, may be thought of as "products" or "articles of manufacture" typically in the form of executable code and/or associated data that is carried on or embodied in a type of tangible non-transitory machine readable medium. Tangible non-transitory "storage" type media include any or all of the memory or other storage for the computers, processors or the like, or associated modules thereof, such as various semiconductor memories, tape drives, disk drives, optical or magnetic disks, and the like, which may provide storage at any time for the executable code.

Additionally, the flowchart and block diagrams in the figures illustrate the architecture, functionality, and operation of possible implementations of systems, methods and computer program products according to various embodiments of the present invention. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Accordingly, the disclosed embodiments include a method, apparatus, and computer program product for providing a dynamic three dimensional tunnel view of an operating envelope of a UBD well while the well is being drilled. As previously stated, one advantage of the disclosed embodiments is that they enable a UBD engineer to visualize on a tunnel view, as the well is being drilled, the area between the reservoir and the target pressure that guarantees the optimum hole cleaning at a given gas injection and liquid pumping rate and a good mud motor operation (i.e., the conditions of interest). Other advantages of the disclosed embodiments include reducing human error as the UBD engineer would no longer need to manually model the operating envelope as well is being drilled. This would enable the UBD engineer instead to increase his analysis time to provide a better estimate of UBD conditions. In addition, the disclosed embodiment would enable better selection of mud motors that adjust to the Equivalent Liquid Rates under given GIR/Liquid Rates. This advantage is especially important because a big percentage of failures are due to mud motor cavitation requiring string trips, which traduces on cost and times.

In addition to the embodiments described above, many examples of specific combinations are within the scope of the disclosure, some of which are detailed below.

For instance, a first example embodiment is a computer-implemented method, system, and/or non-transitory computer readable medium for monitoring underbalanced drilling operations that is configured to execute instructions that perform operations that include generating a three dimensional tunnel view of the operating envelope as the well is being drilled.

A second example embodiment is a computer-implemented method, system, and/or non-transitory computer readable medium for monitoring underbalanced drilling operations that is configured to execute instructions that perform operations that include the steps of generating an operating envelope for a well at a given depth; determining a boundary of a set of conditions of interest of the operating envelope; generating additional operating envelopes as the well is being drilled; and generating a three dimensional tunnel view of the operating envelope as the well is being drilled. In some embodiments of the first and second example, the three dimensional tunnel view of the operating envelope has a start depth, an end depth, and intermediate step depths.

In certain embodiments, the second example embodiment is further configured to execute instructions that perform operations that include generating the additional operating envelopes as the well is being drilled at predetermined depths and/or at predetermined times. Additionally, in certain embodiments, the first and second example embodiments may be further configured to execute instructions that perform operations that include dynamically updating the three dimensional tunnel view of the operating envelope as the well is being drilled. Still, in certain embodiments, the second example embodiment may be further configured to execute instructions that perform operations that include overlapping the operating envelope with the additional operating envelopes as the well is being drilled in generating the three dimensional tunnel view of the operating envelope.

In addition, in certain embodiments, the second example embodiment is further configured to execute instructions that perform operations that include calculating intersection points between a reservoir pressure and a maximum motor liquid rate, the maximum motor liquid rate and a target bottom pressure, the target bottom pressure and a minimum liquid velocity, and the minimum liquid velocity and the reservoir pressure in determining the boundary of the set of conditions of interest of the operating envelope. Further, in certain embodiments, the first and second example embodiments may be further configured to execute instructions that perform operations that include receiving a user-specified depth parameter and displaying a snapshot of the three dimensional tunnel view of the operating envelope at the user-specified depth parameter.

The above detailed description is of a small number of embodiments for implementing the invention and is not intended to limit the scope of the following claims.

The invention claimed is:

1. A computer-implemented method for monitoring underbalanced drilling (UBD) operations within a reservoir formation, the method comprising:
generating, by a processor, a two dimensional (2D) view of an operating envelope for a first section of a well at a given depth within the reservoir formation, the operating envelope defining parameters for drilling the first section of the well;
determining, by the processor, a boundary for conditions of interest of the operating envelope, the boundary defining an area of the operating envelope where constraints are fulfilled during the UBD operations;
generating additional 2D views of the operating envelope as the first section of the well is being drilled, based on the boundary determined for the conditions of interest;
generating a three dimensional tunnel view of the operating envelope as the first section of the well is being drilled, based on the additional 2D views of the operating envelope;
determining parameters for drilling a second section of the well, based on the generated three dimensional tunnel view of the operating envelope; and
drilling the second section of the well within the reservoir formation according to the determined parameters.

2. The computer-implemented method of claim 1, wherein the additional 2D views of the operating envelope are generated for one or more predetermined depths as the first section of the well is being drilled within the reservoir formation.

3. The computer-implemented method of claim 1, wherein the additional 2D views of the operating envelope are generated for one or more predetermined times as the first section of the well is being drilled within the reservoir formation.

4. The computer-implemented method of claim 1, further comprising dynamically updating the three dimensional tunnel view of the operating envelope as the well is being drilled.

5. The computer-implemented method of claim 1, wherein generating the three dimensional tunnel view of the operating envelope comprises overlapping the 2D view of the operating envelope generated for the first section of the well at the given depth with the additional 2D views of the operating envelope generated as the well is being drilled.

6. The computer-implemented method of claim 1, wherein determining the boundary for the conditions of interest of the operating envelope comprises calculating intersection points between a reservoir pressure and a maximum motor liquid rate, between the maximum motor liquid rate and a target bottom pressure, between the target bottom pressure and a minimum liquid velocity, and between the minimum liquid velocity and the reservoir pressure.

7. The computer-implemented method of claim 1, further comprising receiving a user-specified depth parameter and displaying a snapshot of the three dimensional tunnel view of the operating envelope at the user-specified depth parameter.

8. The computer-implemented method of claim 1, wherein the three dimensional tunnel view of the operating envelope has a start depth, an end depth, and intermediate step depths.

9. A system for monitoring underbalanced drilling (UBD) operations within a reservoir formation, the system comprising:
at least one processor; and
at least one memory coupled to the at least one processor and storing instructions that when executed by the at least one processor, causes the at least one processor to perform operations comprising:
generating a two dimensional (2D) view of an operating envelope for a first section of a well at a given depth within the reservoir formation, the operating envelope defining parameters for drilling the first section of the well;
determining a boundary for conditions of interest of the operating envelope, the boundary defining an area of the operating envelope where constraints are fulfilled during the UBD operations;
generating additional 2D views of the operating envelope as the first section of the well is being drilled, based on the boundary determined for the conditions of interest;
generating a three dimensional tunnel view of the operating envelope as the first section of the well is being drilled, based on the additional 2D views of the operating envelope; and
determining parameters for drilling a second section of the well, based on the generated three dimensional tunnel view of the operating envelope, wherein the second section of the well is drilled within the reservoir formation according to the determined parameters.

10. The system of claim 9, wherein the additional 2D views of the operating envelope are generated for one or more predetermined depths as the first section of the well is being drilled within the reservoir formation.

11. The system of claim 9, wherein the additional 2D views of the operating envelope are generated for one or more predetermined times as the first section of the well is being drilled within the reservoir formation.

12. The system of claim 9, wherein the operations further comprises dynamically updating the three dimensional tunnel view of the operating envelope as the well is being drilled.

13. The system of claim 9, wherein generating the three dimensional tunnel view of the operating envelope comprises overlapping the 2D view of the operating envelope generated for the first section of the well at the given depth with the additional 2D views of the operating envelope generated as the well is being drilled.

14. The system of claim 9, wherein determining the boundary for the conditions of interest of the operating envelope comprises calculating intersection points between a reservoir pressure and a maximum motor liquid rate, between the maximum motor liquid rate and a target bottom pressure, between the target bottom pressure and a minimum liquid velocity, and between the minimum liquid velocity and the reservoir pressure.

15. The system of claim 9, wherein the operations further comprises receiving a user-specified depth parameter and displaying a snapshot of the three dimensional tunnel view of the operating envelope at the user-specified depth parameter.

16. The system of claim 9, wherein the three dimensional tunnel view of the operating envelope has a start depth, an end depth, and intermediate step depths.

17. A non-transitory computer readable medium comprising computer executable instructions for monitoring underbalanced drilling (UBD) operations within a reservoir formation, the computer executable instructions when executed causes one or more machines to perform operations comprising:

generating a two dimensional (2D) view of an operating envelope for a first section of a well at a given depth within the reservoir formation, the operating envelope defining parameters for drilling the first section of the well;

determining a boundary for conditions of interest of the operating envelope, the boundary defining an area of the operating envelope where constraints are fulfilled during the UBD operations;

generating additional 2D views of the operating envelope as the first section of the well is being drilled, based on the boundary determined for the conditions of interest;

generating a three dimensional tunnel view of the operating envelope as the first section of the well is being drilled, based on the additional 2D views of the operating envelope; and determining parameters for drilling a second section of the well, based on the generated three dimensional tunnel view of the operating envelope, wherein the second section of the well is drilled within the reservoir formation according to the determined parameters.

18. The non-transitory computer readable medium of claim 17, wherein the operations further comprises dynamically updating the three dimensional tunnel view of the operating envelope as the well is being drilled.

19. The non-transitory computer readable medium of claim 17, wherein the operations further comprises receiving a user-specified depth parameter and displaying a snapshot of the three dimensional tunnel view of the operating envelope at the user-specified depth parameter.

20. The non-transitory computer readable medium of claim 17, wherein the three dimensional tunnel view of the operating envelope has a start depth, an end depth, and intermediate step depths.

\* \* \* \* \*